(12) United States Patent
Koch

(10) Patent No.: US 8,207,791 B2
(45) Date of Patent: Jun. 26, 2012

(54) AMPLIFIER CIRCUIT WITH A FIRST AND A SECOND OUTPUT LINE

(75) Inventor: Stefan Koch, Oppenweiler (DE)

(73) Assignee: Sony Corporation, Tokyo (JP)

( * ) Notice: Subject to any disclaimer, the term of this patent is extended or adjusted under 35 U.S.C. 154(b) by 192 days.

(21) Appl. No.: 12/572,843

(22) Filed: Oct. 2, 2009

(65) Prior Publication Data

US 2010/0182082 A1    Jul. 22, 2010

(30) Foreign Application Priority Data

Jan. 21, 2009    (EP) .................................... 09150981

(51) Int. Cl.
*H03F 3/04*    (2006.01)
*H03F 3/60*    (2006.01)
(52) U.S. Cl. ........................................ 330/301; 330/286
(58) Field of Classification Search .......... 330/301–306; 333/32, 33
See application file for complete search history.

(56) References Cited

U.S. PATENT DOCUMENTS

| 5,767,756 | A  | * | 6/1998 | Hwang ........................ 333/124 |
| 6,727,762 | B1 |   | 4/2004 | Kobayashi |
| 7,656,249 | B2 | * | 2/2010 | Fukuda et al. .................. 333/33 |

FOREIGN PATENT DOCUMENTS

| EP | 0 637 131 A1 | 2/1995 |
| EP | 1 998 437 A1 | 12/2008 |
| WO | WO 2008/018338 A1 | 2/2008 |

\* cited by examiner

*Primary Examiner* — Robert Pascal
*Assistant Examiner* — Khiem Nguyen
(74) *Attorney, Agent, or Firm* — Oblon, Spivak, McClelland, Maier & Neustadt, L.L.P.

(57) ABSTRACT

An amplifier circuit including an amplifier to amplify a signal and to output the amplified signal in a first output, a coupling line connected to the first output line in a first connection point and having a length so that a standing electrical wave is generated in it, and a second output line coupled to the coupling line in a second connection point so that a power level of a resulting signal in the second output line is depending on the power level of the amplified signal in the first output line. The amplifier circuit a high integration of an amplifier circuit and an integrated circuit with small size.

5 Claims, 1 Drawing Sheet

AMPLIFIER CIRCUIT WITH A FIRST AND A SECOND OUTPUT LINE

CROSS-REFERENCE TO RELATED APPLICATIONS

This application claims a benefit of priority to EPO 09150981.0 filed Jan. 21, 2009; the entire contents of which are incorporated herein by reference.

The present invention relates to an amplifier circuit having a first and a second output line. The present invention particularly refers to such an amplifier circuit which can be implemented in integrated circuit having a small size.

BACKGROUND OF THE INVENTION

In the prior art, many different possibilities to realize an amplifier circuit with a first and a second (or more) output line exist. Each of these possible realizations has specific disadvantages, which are overcome by the present invention.

BRIEF SUMMARY OF THE INVENTION

The object of the present invention is to provide an amplifier circuit with a first and a second output line which can realized in a small size while still having a good performance.

The above object is achieved by an amplifier circuit. The amplifier circuit according to the present invention comprises an amplifying means adapted to amplify a signal and to output the amplified signal in a first output line, a coupling line connected to the first output line in a first connection point and having a length so that a standing electrical wave is generated in it, and a second output line coupled to the coupling line in a second connection point so that a power level of a resulting signal in the second output line is depending in the power level of the amplifier signal in the first output line.

The present invention therefore presents an amplifier circuit in which the coupling out of a second output signal is realized after the amplifying means. Thus, an input signal is amplified by the amplifying means and a first amplified output signal is output in the first output line. From the first output line, a second amplified output signal is coupled out. The first and the second amplified output signals of the amplifier circuit of the present invention are output, wherein the second amplified signal in the second output line (also called the resulting signal) has a power level which depends on the power level of the amplifier signal in the first output line (i.e. the first amplified output signal). The power levels of the first and the second amplified output signal may but do not have to be equal. However, a change in the output power level of the first amplified output signal, for example when the amplification in the amplifying means is changed, results in a change of the output power level of the second amplified output signal.

The present invention suggests to couple out the second amplified output signal by means of a coupling line which is connected to the first output line in a first connection point. In other words, the coupling line is connected to a physical point of the first output line. This is in contrast to any kind of coupling in which the coupling line and the output line would not touch each other and are thus not be physically connected. Further, the length of the coupling line is set and the location of the first connection point on the first output line is chosen so that a standing electrical wave is generated in the coupling line. Further, the second output line is physically coupled to the coupling line in a second connection point, whereby the second connection point on the coupling line is chosen so that the second amplifier output signal in the second output line has the wanted power level which depends on the power level of the amplifier signal in the first output line. In other words, the output signals of the first output line and the second output line are coupled in power (i.e. depend on each other in respect to the power levels), but are decoupled in isolation by means of the specific way of the coupling. The signal in the second output line is coupled out from the first output line with very little and almost no losses from a high frequency point of view. Further, from a DC point of view, the power consumption of the amplifier circuit proposed by the present invention is relatively small. A further advantage of the amplifier circuit of the present invention is that it can be realized in a comparatively small size, so that an implementation in an integrated circuit with a very small size is possible.

Advantageously, the first connection point is located in a region of the first output line where a low electric field exists. Hereby, the impact on the signal in the first output line is very small and the losses are quite low. Further, an impedance matching of the first output line is only influenced to a very little extent. Although the optimum results for coupling out the signal from the first output line are achieved when the first connection point is located exactly at the point of the first output line where the electrical field generated by the amplified signal in the first output line has a minimum, it may not be necessary to exactly chose such a minimum point but to select a point nearby such a minimum point as the first connection point in order to achieve the main advantages of the present invention.

Further advantageously, the length of the coupling line is N times $\lambda/2$, $\lambda$ being the wavelength of the center frequency of an operation frequency bandwidth of the amplifier circuit and N being an integer larger or equal 1. Hereby, a standing electrical wave is generated in a coupling line from the electrical field generated by the amplifier signal in the first output line. However, implementations may be possible, in which the length of the coupling line is not exactly N times $\lambda/2$, but deviates a little from this exact value, depending on a specific implementation.

Further advantageously, the second connection point is located in a region of the coupling line where the standing electrical wave has a maximum. Hereby, the resulting signal in the second output line has a maximum power level. In case, that the length of the coupling line is N times $\lambda/2$, as discussed above, the distance of the second connection point from the first connection point could be any impair multiple of $\lambda/4$ (of course provided that the second connection point has to be located on the coupling line). Particularly advantageously, the second connection point is located at a point of the coupling line in which the standing electrical wave has a maximum. Hereby, an optimum efficiency could be achieved. However, the main advantages of the present invention are still achieved if the second connection point is located in an area nearby or closed to such a maximum in the coupling line.

Further advantageously, the second output line comprises a high impedance circuit for coupling out a signal from the second connection point. This high impedance circuit is further advantageously an amplifier, such as a common source amplifier or the like. Having a high impedance circuit or even an amplifier in the second output line has the advantage of a good isolation between the second output line and the first output line and the further advantage that impedance changes on the first or the second output line do not influence the other output line.

The first output line could for example be a normal main output line of an amplifier circuit and the second output line could for example be a monitor output line of the amplifier circuit. The amplifying means could be a fixed or a variable gain amplifier. In case that an amplifier is arranged in the second output line, this amplifier could for example be a fixed gain amplifier in case that the amplifying means amplifying the input signal is a variable gain amplifying means and vice versa.

It is to be understood that the amplifying means of the amplifier circuit of the present invention can be any kind of suitable amplifier adapted to amplify an input signal and to output an amplified signal in an output line. Further, the amplifier which can be optionally arranged in the second output line of the amplifier circuit of the present invention can be any kind of suitable amplifier adapted to amplify an input signal into an amplified output signal. The lines comprised in the amplifier circuit of the present invention, such as the first output line, the coupling line and the second output line, could be realized with any kind of suitable lines or circuitry adapted to guide electric signals. Additional suitable elements, such as resistors, impedances, capacitors or any other suitable electrical circuitry element could be comprised in the various lines in order to optimize the respective implementation. For example, the coupling line could comprise one or more capacitors to reduce the effective length necessary to achieve the optional N times $\lambda/2$ length.

BRIEF DESCRIPTION OF THE SEVERAL VIEWS OF THE DRAWINGS

The present invention will now be explained in more detail in the following description of preferred embodiments referring to the enclosed drawings, in which.

DETAILED DESCRIPTION OF THE INVENTION

Figure 1:
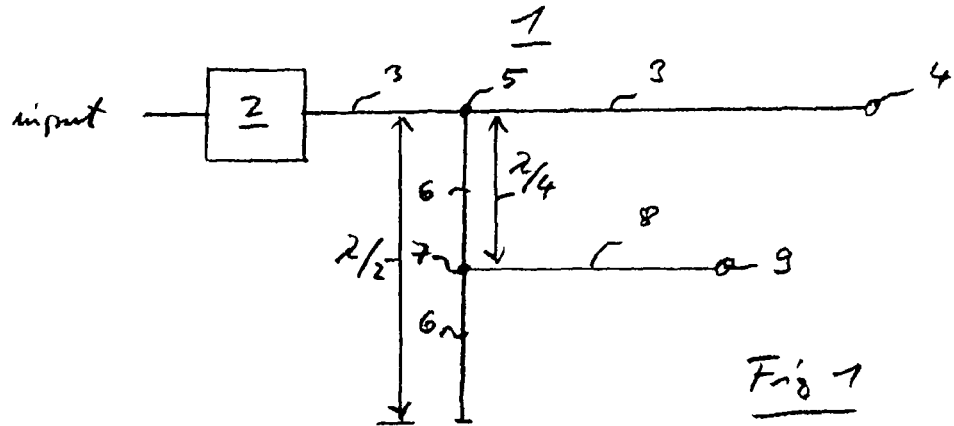
FIG. 1 shows a schematic block diagram of general embodiment of an amplifier circuit according to the present invention.

FIG. 1 shows the schematic block diagram of a general embodiment of an amplifier circuit 1 according to the present invention. The amplifier circuit 1 comprises an amplifying means 2 which is adapted to amplify an input signal supplied by an input line and to output an amplified signal in a first output line 3. The amplifying means 2 can be realize as any kind of suitable amplifier, amplifier unit, amplifier element, which could for example be a variable gain amplifier, a fixed gain amplifier or the like. The first output line 3 supplies the amplified signal to an output terminal 4. Hereby, the first output line 3 can be implemented as any suitable line suitable for conducting and supplying the amplified signal. The first output line may, depending on the required implementation, comprise further elements such as resistors, capacitors, impedances and so forth.

The amplifier circuit 1 further comprises a coupling line 6 which is connected to the first output line 3 in a first connection point 5. The first connection point 5 is a physical connection point in which the coupling line 6 is in physical contact with the first output line 3. Hereby, the first connection point 5 is located in a region of the first output line 3 where a low electrical field in the first output line exists. The amplified signal output from the amplifying means 2 in the first output line 3 generates an electric field in the first output line 3. The location of the first connection point 5 in the first output line 3 is then chosen in respect to the electrical field. Specifically, the location of the first connection point 5 is chosen to lie within a region of the first output line 3 in which the electrical field is low or has a minimum (in the operation bandwidth). Advantageously, the location of the first connection point is in a minimum of the electrical field. Further, the coupling line 6 has a length so that a standing electrical wave is generated in it. This standing electrical wave is coupled out from the electrical field of the first output line 3. Hereby, the length of the coupling line 6 should be N times $\lambda/2$, wherein $\lambda$ is the center frequency of the operation frequency bandwidth of the amplifier circuit 1 and N is an integer larger or equal to 1.

The amplifier circuit 1 further comprises a second output line 8 which is coupled to the coupling line 6 in a second connection point 7. The connection point 7 is a physical connection between the coupling line 6 and the second output line 8. The power level of the resulting signal in the second output line 8 is depending on the power level of the amplified signal in the first output line 3. In other words, a variation of the power level of the amplified signal in the first output line 3 results in a variation of the power level of the resulting signal in the second output line 8. The second connection point 7 is hereby located in a region of the coupling line 6 where the standing electrical wave in the coupling line 6 has a maximum. A maximum signal level for the resulting signal in the second output line 8 is achieved when the second connection point is located exactly at a location where the standing electrical wave in the coupling line 6 has a maximum.

Figure 2:
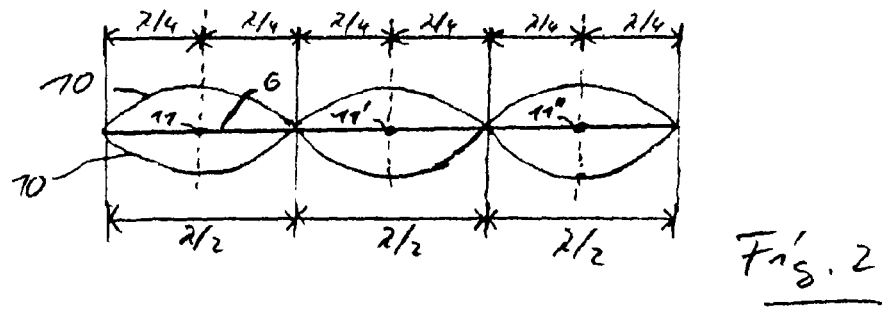
FIG. 2 shows a schematic diagram of standing electrical wave generated in the coupling line.

FIG. 2 schematically shows a standing electrical wave 10 generated in the coupling line 6 by the electrical field of a first output line 3. As shown in FIG. 2, the standing electrical wave 10 of the coupling line 6 has a sinusoidal shape, whereby the minimum points of the standing electrical wave are located at a distance of $\lambda/2$ from each other, $\lambda$ being the wavelength corresponding to the center frequency of the operation frequency bandwidth of the amplifier circuit 1. This means that the maximum points of the standing electrical wave 10 are also located at a distance of $\lambda/2$ from each other. From FIG. 2 it becomes immediately clear that the length of the coupling line 6 need to be N times $\lambda/2$ in order to obtain a standing electrical wave. Further, in order to couple out a resulting signal with a high signal level in the second output line 8, the second output line 8 should be connected to the coupling line 6 in a point near or at a maximum of the standing electrical wave. Such points are identified in FIG. 2 as points 11, 11' and 11", which are respectively located in a distance of $\lambda/4$ from the neighboring minimum points of the electrical wave. Thus, in the embodiment in FIG. 1 in which the coupling line has a length of $\lambda/2$, the second connection point 7 is located at a distance of $\lambda/4$ from the first connection point 5. Generally, the distance of the second connection point 7 from the first connection point 5 is an impair integer multiplied with $\lambda/4$ on the coupling line 6.

It should be understood that the length of the coupling line 6 is not necessarily the absolute length of the coupling line, but is an effective electrical length of the line as well as optionally comprises resistors, impedances and the like which cause a standing electrical wave to be generated in the coupling line 6. Further, it is to be noted that the amplifier circuit 1 as shown in FIG. 1 may comprise additional elements depending on the respectively required implementation. For example, the second output line 8 may comprise the high impedance circuit, which could for example be any kind of suitable amplifier adapted to amplify the resulting signal in the second output line 8. The amplified (or the non-amplified) resulting signal of the second output line 8 is supplied to a second output terminal 9. For example, the first output terminal 4 may be a main output terminal of the amplifier circuit 1, and the second output terminal 9 may be a monitor output terminal outputting a monitor signal.

Figure 3:
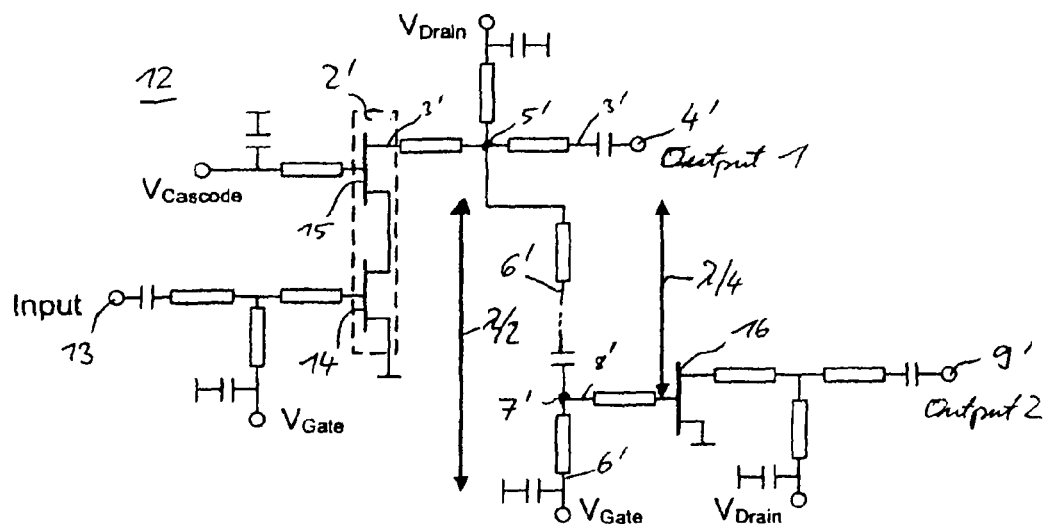
FIG. 3 shows a detailed block diagram of a more detailed embodiment of an amplifier circuit of the present invention.

FIG. 3 shows a more detailed embodiment of an amplifier circuit 12 according to the present invention. The general structure of the amplifier circuit 12 corresponds to the structure of the amplifier circuit 1 as shown in and explained in relation to FIGS. 1 and 2. Therefore, all statements and explanations made above in relation to FIGS. 1 and 2 also apply to the amplifier circuit 12 shown in FIG. 3. Similar elements are identified with similar reference numerals, for example for the amplifying means 2' of the amplifier circuit 12 corresponds to the amplifying means 2 of the amplifier circuit 1. The same is true for a first output line 3' which corresponds to the first output line 3, the coupling line 6' which corresponds to a coupling line 6, the second output line 8' which corresponds to the second output line 8 as well as the first connection point 5' which corresponds to the first connection point 5 and the second connection point 7' which corresponds to the second connection point 7. Thus, the amplifier circuit 12 of the embodiment shown in FIG. 3 has the same structure as the amplifier circuit 1 shown in FIG. 1, but has more implementation details. The amplifying means 2' which is adapted to amplify an input signal input via an input terminal 13 to an amplified signal in the first output line 3' is realized by a cascode amplifier consisting of a first and a second amplifier 14 and 15. The first amplifier 14 is controlled by a gate voltage $V_G$ and the second amplifier 15 is controlled by a cascode voltage $V_C$. The first output line 3' of the second amplifier 15 is controlled by a drain voltage $V_D$ which generates drop in respect to the first connection point 5' which represents a physical connection of the coupling line 6'. The second output line 8' is connected to the coupling line 6' in the second connection point 7' representing a physical connection. The second output line 8' comprises a further amplifier 16 which is controlled by a gate voltage $V_G$ supplied at the end of the coupling line 6' opposite to the first connection point 5'. The output of the amplifier 16 is controlled by a drain voltage $V_D$ causing that the resulting signal in the second output line 8' is amplified in the amplifier 16 and is supplied as an amplified resulting signal to a second output terminal 9'. The amplifier 16 in the shown example is a common source amplifier but could be any other suitable amplifier element. The first output terminal 4' delivers the amplified signal of the first output line 3'.

Further, the input lines to the amplifying means 2' as well as the first output line 3', the coupling line 6' and the output line 8' all comprise additional elements such as resistors, capacitors and so forth necessary for a suitable implementation of the amplifier circuit 12. As can be seen in the coupling line 6', the effective electrical length of the coupling line 6' (N times $\lambda/2$) can be reduced by adding suitable inductor capacitor networks.

The invention claimed is:

1. An amplifier circuit, comprising:
an amplifier configured to amplify a signal;
a first output line coupled to the amplifier to output the amplified signal to a first output terminal;
a coupling line connected to the first output line in a first connection point and having a length so that a standing electrical wave is generated in the coupling line; and
a second output line coupled to the coupling line in a second connection point to output a resulting signal to a second output terminal so that a power level of the resulting signal in the second output line is dependent on the power level of the amplified signal in the first output line,
wherein the first connection point is located in a region on the first output line where a low electrical field exists.

2. An amplifier circuit, comprising:
an amplifier configured to amplify a signal;
a first output line coupled to the amplifier to output the amplified signal to a first output terminal;
a coupling line connected to the first output line in a first connection point and having a length so that a standing electrical wave is generated in the coupling line; and
a second output line coupled to the coupling line in a second connection point to output a resulting signal to a second output terminal so that a power level of the resulting signal in the second output line is dependent on the power level of the amplified signal in the first output line,
wherein the length of the coupling line is N times $\lambda/2$, $\lambda$ being the wavelength of the center frequency of an operation frequency bandwidth of the amplifier circuit and N being an integer $\geq 1$.

3. An amplifier circuit, comprising:
an amplifier configured to amplify a signal;
a first output line coupled to the amplifier to output the amplified signal to a first output terminal;
a coupling line connected to the first output line in a first connection point and having a length so that a standing electrical wave is generated in the coupling line; and
a second output line coupled to the coupling line in a second connection point to output a resulting signal to a second output terminal so that a power level of the resulting signal in the second output line is dependent on the power level of the amplified signal in the first output line,
wherein the second connection point is located in a region of the coupling line where the standing electrical wave has a maximum.

4. An amplifier circuit, comprising:
an amplifier configured to amplify a signal;
a first output line coupled to the amplifier to output the amplified signal to a first output terminal;
a coupling line connected to the first output line in a first connection point and having a length so that a standing electrical wave is generated in the coupling line; and
a second output line coupled to the coupling line in a second connection point to output a resulting signal to a second output terminal so that a power level of the resulting signal in the second output line is dependent on the power level of the amplified signal in the first output line,
wherein the second output line comprises a high impedance circuit for coupling out a signal from the second connection point.

5. The amplifier circuit according to claim 4,
wherein the high impedance circuit is a common source amplifier.

* * * * *